United States Patent
Batra et al.

[11] Patent Number: 5,953,596
[45] Date of Patent: Sep. 14, 1999

[54] METHODS OF FORMING THIN FILM TRANSISTORS

[75] Inventors: Shubneesh Batra, Boise; Monte Manning, Kuna, both of Id.; Sanjay Banerjee, Austin, Tex.; LeTien Jung, Taiwan, Taiwan

[73] Assignee: Micron Technology, Inc., Boise, Id.

[21] Appl. No.: 08/769,652

[22] Filed: Dec. 19, 1996

[51] Int. Cl.[6] .................. H01L 21/00; H01L 21/84
[52] U.S. Cl. ......................... 438/159; 438/163
[58] Field of Search ................... 438/157, 158, 438/159, 163, 596, FOR 155, FOR 183, FOR 184, FOR 200, FOR 201; 257/66, 61, 57, 365, 366, 335

[56] References Cited

U.S. PATENT DOCUMENTS

| | | | |
|---|---|---|---|
| 4,714,519 | 12/1987 | Pfiester | 438/596 |
| 4,868,617 | 9/1989 | Chiao et al. | |
| 4,945,067 | 7/1990 | Huang | 438/157 |
| 5,091,763 | 2/1992 | Sanchez | 438/596 |
| 5,124,769 | 6/1992 | Tanaka et al. | 257/365 |
| 5,262,655 | 11/1993 | Ashida | 438/163 |
| 5,290,720 | 3/1994 | Chen | 438/596 |
| 5,358,879 | 10/1994 | Brady et al. | 437/21 |
| 5,418,392 | 5/1995 | Tanabe. | |
| 5,446,304 | 8/1995 | Sameshima et al. | 257/365 |
| 5,475,238 | 12/1995 | Hamada | 257/366 |
| 5,593,909 | 1/1997 | Han et al. | 437/41 |
| 5,600,153 | 2/1997 | Manning et al. | 257/66 |

FOREIGN PATENT DOCUMENTS

| | | |
|---|---|---|
| 6-151851 | 5/1994 | Japan. |
| 7-86605 | 3/1995 | Japan. |
| 8-78696 | 3/1996 | Japan. |
| 8-88375 | 4/1996 | Japan. |

OTHER PUBLICATIONS

Batra, Shubneesh, "Development of Drain–Offset (DO) TFT Technology for High Density SRAMs", Extended Abstracts, ECS Meeting, Miami, FL, Oct. 1994, pp. 677–678.

Furuta, Hiroshi et al., "Hot–Carrier Induced ION/OFF Improvement of Offset PMOS TFT", NEC Corporation, Date Unknown, pp. 27–28.

Tanaka, Keiji et al., "Field–Induction–Drain (FID) Poly–Si TFT's with High On/Off Current Radio", Extended Abstracts of 22nd Conference on Solid State Devices and Materials, Sendai, 1990, pp. 1011–1014.

Hashimoto, T. et al., "Thin Film Effects of Double–Gate Polysilicon MOFSET", Extended Abstracts of the 22nd Conference on Solid State Devices and Materials, Sendai, 1990, pp. 393–396.

Hayden, J.D. et al., "A High–Performance Quadruple Well Quadruple Poly BiCMOS Process for Fast 16MB SRAMs", pp. 812–822, IEDM Proc. 1992.

T. Zhao et al., IEDM '93 Proc., P. 393 "A novel floating gate spacer polysilicon TFT", 1993.

*Primary Examiner*—Charles Bowers
*Assistant Examiner*—Scott J. Hawranek
*Attorney, Agent, or Firm*—Wells, St. John, Roberts, Gregory & Matkin, P.S.

[57] ABSTRACT

A method of forming film transistor includes, a) forming a thin film transistor layer of semiconductive material; b) providing a gate operatively adjacent the thin film transistor layer; c) forming at least one electrically conductive sidewall spacer over at least one lateral edge of the gate, the spacer being electrically continuous therewith; and d) providing a source region, a drain region, a drain offset region, and a channel region in the thin film transistor layer; the drain offset region being positioned operatively adjacent the one electrically conductive sidewall spacer and being gated thereby. The spacer is formed by anisotropically etching a spacer forming layer.

4 Claims, 4 Drawing Sheets

METHODS OF FORMING THIN FILM TRANSISTORS

PATENT RIGHTS STATEMENT

This invention was made with Government support under Contract No. MDA972-92-C-0054 awarded by Advanced Research Projects Agency (ARPA). The Government has certain rights in this invention.

TECHNICAL FIELD

This invention relates to thin film transistors and methods of forming thin film transistors.

BACKGROUND OF THE INVENTION

As circuit density continues to increase, there is a corresponding drive to produce smaller and smaller field effect transistors. Field effect transistors have typically been formed by providing active areas within a bulk substrate material or within a complementary conductivity type well formed within a bulk substrate. One additional technique finding greater application in achieving increased circuit density is to form field effect transistors with thin films (i.e., polysilicon films of less than or equal to 1500 Angstroms thickness), which is commonly referred to as "thin film transistor" (TFT) technology. These transistors are formed using thin layers which constitute all or a part of the resultant source and drain regions.

Specifically, typical prior art TFT's are formed from a thin film of semiconductive material (typically polysilicon). A central channel region of the thin film is masked by a separate layer, while opposing adjacent source/drain regions are doped with an appropriate p or n type conductivity enhancing impurity. A gate insulator and gate are provided either above or below the thin film channel region, thus providing a field effect transistor having source/drain and channel regions formed within a thin film as opposed to a bulk substrate.

Literature reports have shown that it is possible to enhance the performance of thin film transistors, and particularly polysilicon thin film transistors, by using a drain offset between the channel region and the drain region. The prior art literature reports provision of such layer to have a doping concentration identical to that of the channel region, or more preferably to have a lower dopant concentration of the opposite conductivity type.

Utilization of drain offset regions in thin film transistors is particularly advantageous in static random access memory (SRAM) cell and active matrix display constructions. Typical resistor load SRAM cells are not suitable for high density SRAMs as the resistor loads do not provide desired low leakage, cell stability or alpha-particle immunity. The polysilicon TFT loads in six transistor stacked CMOS SRAM cells can provide the required low leakage while providing high ON currents at the same time which makes the cell more immune to alpha particle hits or high junction leakage. Such transistors are more suitable for high density SRAMs. The drain offset region in such transistors reduces the electric field near the drain which reduces the leakage, but this also has an adverse effect on the ON current.

Attributes of the invention will be more readily appreciated by an initial description of two prior art processes for producing thin film transistors having drain offsets. For example, FIG. 1 illustrates a semiconductor wafer fragment 10 comprised of a substrate 12. An insulating layer 13 is provided thereover, and includes an intervening or embedded electrically conductive transistor gate 14. That portion of substrate 12 immediately beneath layer 13 and gate 14 would comprise an insulator material. A gate dielectric layer 16 overlies insulating layer 13 and gate 14. Further, a thin film transistor layer 18 is provided over gate dielectric layer 16.

In accordance with prior art methods, thin film transistor layer 18 is subjected to a blanket implant, in this described example an n-type dopant, to some suitable first low concentration, such as $5 \times 10^{17}$ atoms/cm$^3$–$1 \times 10^{18}$ atoms/cm$^3$. The function of the blanket implant is to provide desired resultant semiconductivity (i.e., conductivity that can be selectively "on" or "off" dependent upon selected gate voltage) for the channel region of the transistor.

Referring to FIG. 2, a mask 19 is provided over thin film transistor layer 18 to define a desired n-type channel region 20 overlying gate 14. Wafer 10 is then subjected to p-type doping to provide an example p– implant concentration outside of mask 19 to provide an example p– concentration of from $5 \times 10^{17}$ atoms/cm$^3$–$5 \times 10^{18}$ atoms/cm$^3$. The purpose of such implant is to counterdope the blanket n-type implant previously provided to produce a desired drain offset region doping.

Referring to FIG. 3, channel region 20 and what becomes a desired drain offset region 24 are masked with a photoresist masking block 25. Wafer fragment 10 is then subjected to heavy p-type doping to provide a resultant p+ concentration of, for example, greater than or equal to $1 \times 10^{19}$ atoms/cm$^3$. The result is provision of desired source and drain regions 26 and 27, respectively. The effect is to produce a lighter doped drain offset region of the same conductivity type as the source and drain regions between the channel and drain regions.

An alternate prior art method of producing thin film transistors having drain offsets is described with reference to FIG. 4. Like numerals from the first described embodiment are utilized where appropriate, with differences being indicated by the suffix "a", or with different numerals. FIG. 4 in this described embodiment depicts a processing step immediately subsequent to the FIG. 1 processing step of the first described embodiment. Here, a masking block 19a is patterned to overlap or extend laterally beyond the confines of gate 14 to provide a source offset region 17 and a drain offset region 24a. The wafer is then subjected to heavy p+ doping to produce the illustrated source and drain regions 26a and 27a, respectively. Therefore in accordance with this described prior art embodiment, the resultant drain offset region 24a is provided to be of the same identical concentration and conductivity type as that of channel region 22.

Yet another alternate prior art embodiment and method is shown in FIGS. 5 and 6. Like numerals from the first described embodiment are utilized where appropriate, with differences being indicated by the suffix "b" or with different numerals. FIG. 5 illustrates a wafer fragment 10b shown at a processing step immediately subsequent to that depicted by FIG. 1 of the first described embodiment. Here, a photoresist masking layer 19b is patterned to provide an opening 21 effective for producing a desired drain offset region 24. The wafer fragment is then subjected to light p-type doping, yet to a concentration sufficient to overwhelm the n– concentration previously provided in drain offset region 24 by the FIG. 1 blanket implant.

Referring to FIG. 6, masking block 25 is provided and the wafer subjected to p+ doping to effectively produce the same resultant prior art construction of FIG. 3.

The prior art also has recognized improvements in operation by gating the drain offset region, such as reported in our prior art paper, Batra et al. "Development of Drain-Offset (DO) TFT Technology For High Density SRAMs, Extended Abstracts" October 1994, pp. 677–678.

This invention concerns improvements in method of producing thin film transistors having gated drain offsets.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of forming a thin film transistor comprises the following steps:

forming a thin film transistor layer of semiconductive material;

forming a gate over the thin film transistor layer operatively adjacent a desired channel region of the thin film transistor layer;

providing at least one electrically conductive sidewall spacer over at least one lateral edge of the gate; and after providing the sidewall spacer, subjecting unmasked areas of the thin film transistor layer to conductivity doping effective to form an electrically conductive source region and an electrically conductive drain region.

In accordance with another aspect of the invention, a method of forming a thin film transistor comprises the following steps:

forming a transistor gate relative to a substrate;

providing at least one electrically conductive sidewall spacer over at least one lateral edge of the gate;

providing a thin film transistor layer of semiconductive material over the gate and sidewall spacer; and providing a source region, a drain region, a drain offset region, and a channel region in the thin film transistor layer; the drain offset region being positioned operatively over the one electrically conductive sidewall spacer and being gated thereby.

In accordance with still a further aspect of the invention, a thin film transistor comprises:

a thin film transistor layer of semiconductive material; a source region, a drain region, a drain offset region, and a channel region provided in the thin film transistor layer;

a gate operatively adjacent the thin film transistor layer and positioned operatively transverse the channel region of the thin film transistor layer for gating thereof; and an electrically conductive and anisotropically etched spacer laterally adjacent the gate and transverse the drain offset region of the thin film transistor layer for gating thereof.

Figure 1:
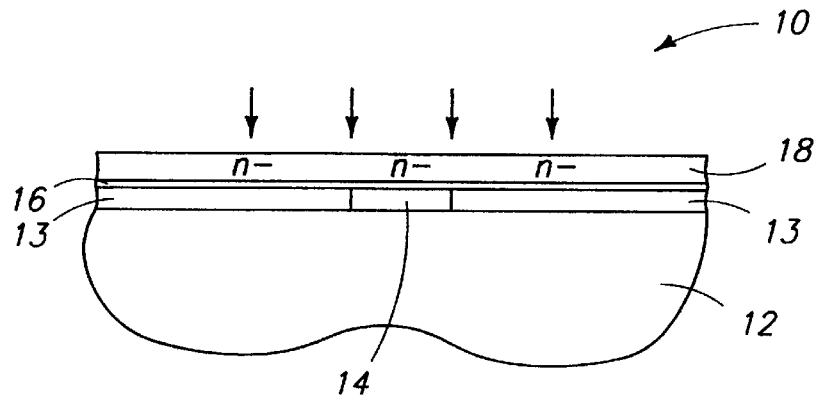
FIG. 1 is a diagrammatic sectional view of one prior art wafer fragment and is discussed in the "Background" section above.
Figure 2:
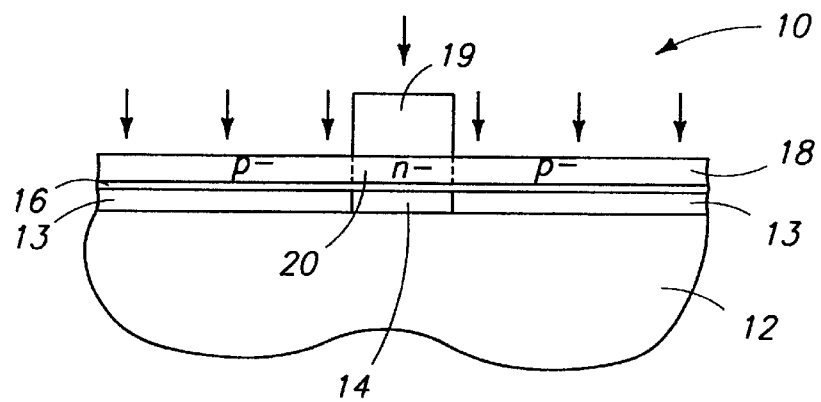
FIG. 2 is a view of the prior art FIG. 1 wafer at a prior art processing step subsequent to that shown by FIG. 1.
Figure 3:
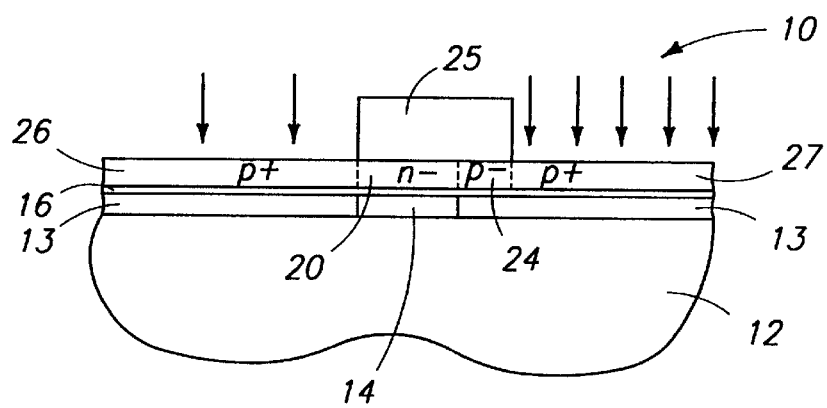
FIG. 3 is a view of the prior art FIG. 1 wafer at a prior art processing step subsequent to that shown by FIG. 2.
Figure 4:
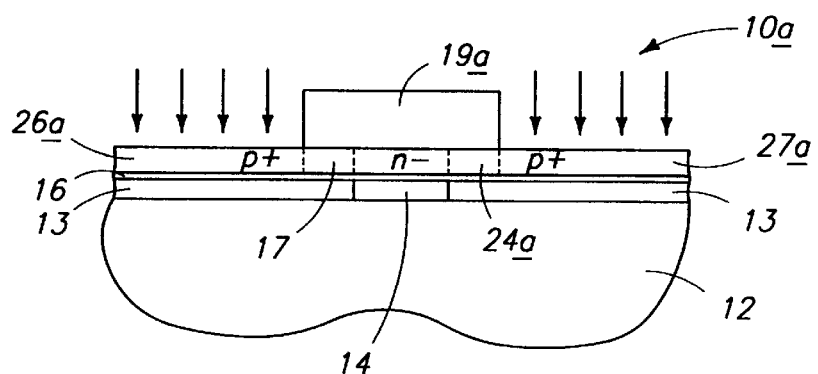
FIG. 4 is a diagrammatic sectional view of another prior art wafer fragment and is discussed in the "Background" section above.
Figure 5:
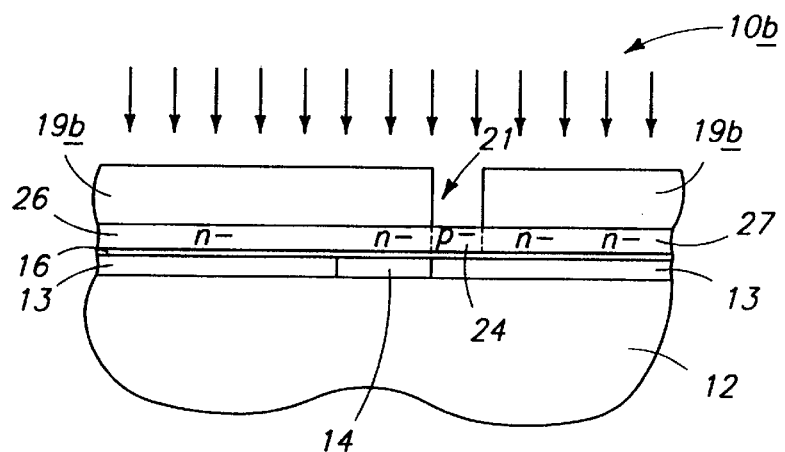
FIG. 5 is a diagrammatic sectional view of yet another prior art wafer fragment and is discussed in the "Background" section above.
Figure 6:
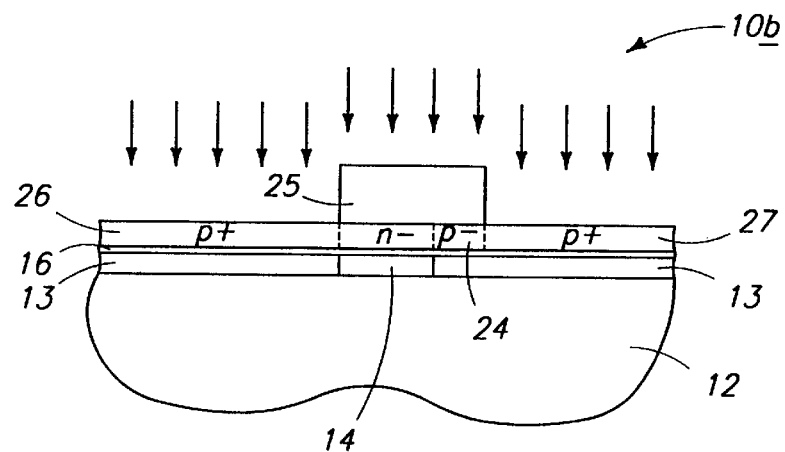
FIG. 6 is a view of the prior art FIG. 5 wafer at a prior art processing step subsequent to that shown by FIG. 5.
Figure 7:
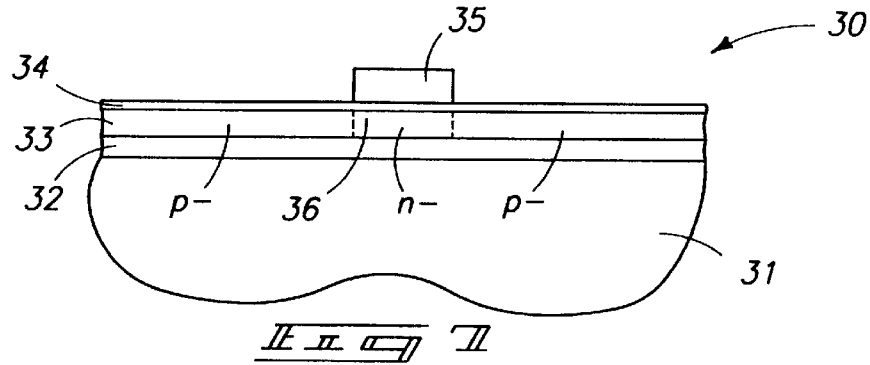
FIG. 7 is a diagrammatic sectional view of a wafer fragment at one processing step in accordance with the invention.

A first preferred embodiment is described with reference to FIGS. 7–10. Referring first to FIG. 7, a semiconductor wafer fragment in process for forming a thin film transistor in accordance with the invention is indicated generally with reference numeral 30. Such comprises a bulk monocrystalline silicon wafer 31 processed to the point of adding thin film transistors, an overlying insulating oxide layer 32, a thin film transistor layer 33 of semiconductive material and a gate dielectric layer 34 provided over thin film transistor layer 33. Layer 33 preferably comprises undoped polycrystalline silicon as-deposited. A gate 35 is provided over gate dielectric layer 34 and operatively adjacent or inherently defining a channel region 36 within layer 33 therebeneath.

Thin film transistor layer 33 is provided with a suitable conductivity enhancing impurity prior to provision of gate 35. For example for PMOS devices, thin film transistor layer 33 would most typically be doped to a concentration of n-type material at $5 \times 10^{17}$ atoms/cm$^3$–$5 \times 10^{18}$ atoms/cm$^3$. Such can be provided by in situ doping layer 33 during its deposition to provide such impurity concentration. Alternately, layer 33 can be so doped after its deposition and prior to provision of gate 35, such as by ion implantation. Gate 35 typically and preferably comprises polysilicon having in this PMOS example an n-type conductivity enhancing impurity concentration of $5 \times 10^{19}$ atoms/cm$^3$ or greater. In one preferred and the illustrated embodiment, fragment 30 is subjected to p– doping to a preferred concentration of five times the dopant concentration value of the n-type channel to produce the illustrated p– regions.

Figure 8:
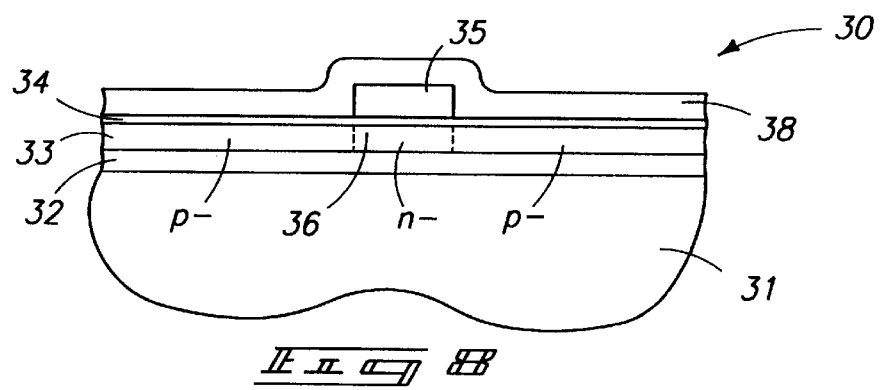
FIG. 8 is a view of the FIG. 7 wafer at a processing step subsequent to that shown by FIG. 7.

Referring to FIG. 8, a spacer-forming layer 38 is provided over gate 35 and gate dielectric layer 34. The preferred material of construction is the same material as that of gate 35, namely a semiconductor material layer such as polysilicon.

Figure 9:
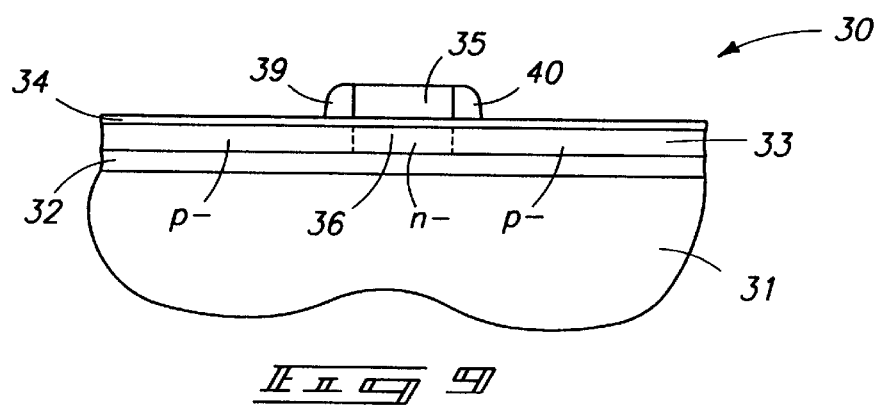
FIG. 9 is a view of the FIG. 7 wafer at a processing step subsequent to that shown by FIG. 8.

Referring to FIG. 9, spacer-forming layer 38 is anisotropically etched to provide sidewall spacers 39 and 40 laterally adjacent gate 35. Such sidewall spacers are provided to be electrically conductive. Such can occur by any of a number of different examples. Specifically, spacer-forming layer 38 be electrically conductive as-deposited, for example constituting $WiSi_x$, $CoSi_2$, heavily conductively doped (i.e., at least $1 \times 10^{19}$ atoms/cm$^3$) polycrystalline silicon, or some other inherently conductive material. Accordingly, such a layer would be inherently electrically conductive as-deposited, with spacers 39 and 40 inherently being electrically conductive upon their formation. Alternately, layer 38 as-deposited can be undoped semiconductor material, which is subsequently doped by ion implantation or other technique thereafter. Also, layer 38 could be amorphous as-deposited (doped or undoped) and subsequently rendered electrically conductive in crystalline form.

Spacers 39 and 40, if of a semiconductor material, can be rendered suitably electrically conductive even if undoped as-provided after their formation. For example, out-diffusion of conductivity enhancing impurity from gate 35 through native oxide into the spacers, if the impurity concentration in gate 35 is sufficiently high such as greater than $1 \times 10^{19}$ atoms/cm$^3$, could effectively or substantially occur after spacer formation. Alternately, an ion implantation step can be provided for doping spacers 39 and 40 after their formation where the source/drains and gate polysilicon have the same type conductivity.

Further alternately, the electrically conductive spacers might be provided in other manners not utilizing an anisotropically etched spacer layer, such as by a selective growth process on one or both sides of the gate.

Figure 10:
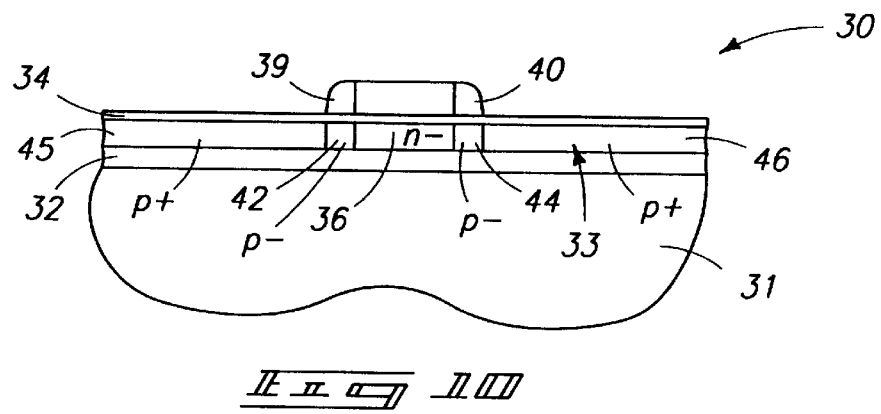
FIG. 10 is a view of the FIG. 7 wafer at a processing step subsequent to that shown by FIG. 9.

Referring to FIG. 10, areas of thin film transistor layer 33 not masked by gate 35 and sidewall spacers 39 and 40 are conductively doped by a suitable implant impurity to an effective concentration to form an electrically conductive source region 45 and an electrically conductive drain region 46 laterally outward of sidewall spacers 39 and 40, respectively. An example dopant would be p-type material, such as $BF_2$, to provide a boron implantation concentration of greater than or equal to $1 \times 10^{19}$ atoms/cm$^3$.

The one sidewall spacer 40 adjacent or intermediate drain region 46 and channel 36 defines a thin film drain offset region 44 therebeneath within thin film transistor semiconductor material layer 33, which is effectively gated by conductive spacer 40 which is transverse region 44. Likewise, spacer 39 adjacent or intermediate source region 45 and channel 36 defines a source offset region 42 therebeneath.

In accordance with the above described preferred processing embodiment, drain offset region 44 is provided to be doped with a conductivity enhancing impurity type the opposite that of channel region 36, and to a slightly higher dopant concentration. Alternate provisions for drain offset region 44 might also be provided. For example, drain offset region 44 might be provided to have an n-type concentration which is the same or less than that of the channel region or no impurity doping concentration whatsoever. In the context of this preferred embodiment, the preferred processing is as shown and described immediately above. From an operational standpoint, the preferred construction would be to provide drain offset region 44 to be essentially undoped.

Figure 11:
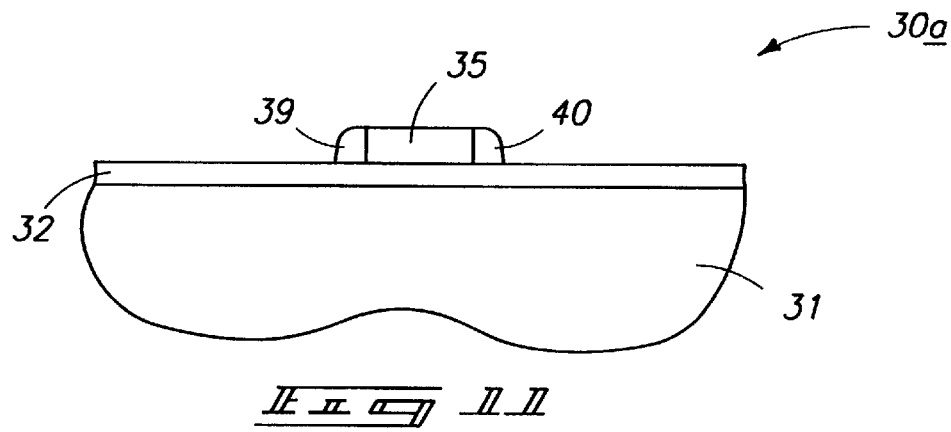
FIG. 11 is a diagrammatic sectional view of an alternate embodiment wafer fragment produced in accordance with the invention.
Figure 12:
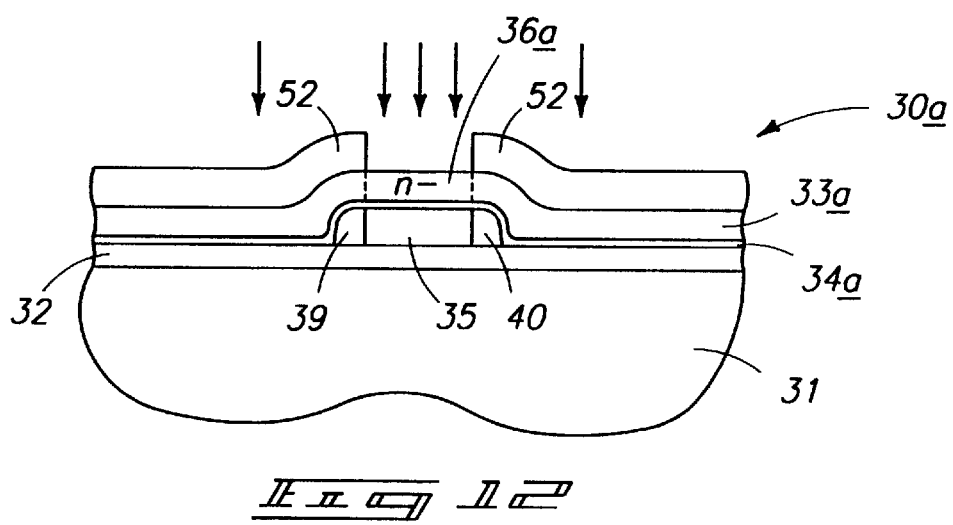
FIG. 12 is a view of the FIG. 11 wafer at a processing step subsequent to that shown by FIG. 11.
Figure 13:
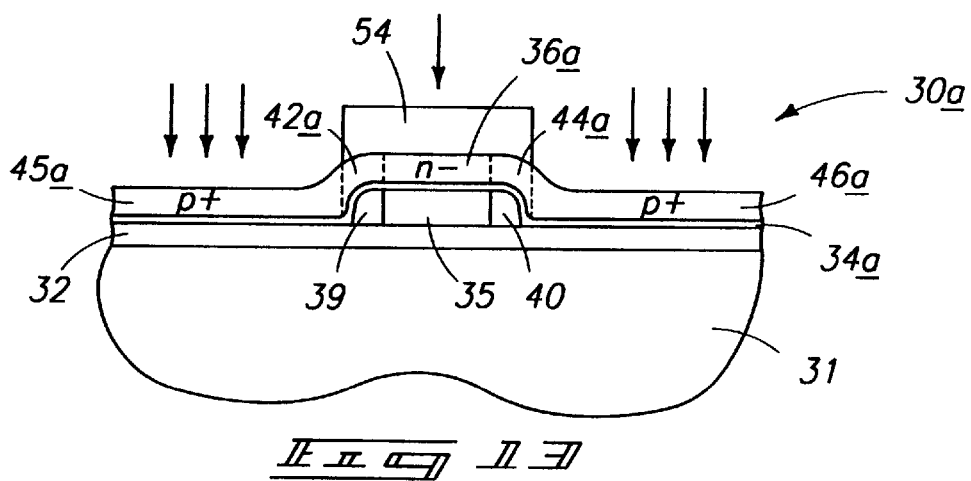
FIG. 13 is a view of the FIG. 11 wafer at a processing step subsequent to that shown by FIG. 12.

The above described example is but one method of forming a top gated thin film transistor. FIGS. 11–13 show an alternate processing method whereby a bottom gated thin film transistor is formed in accordance with the invention. Like numerals from the first described embodiment are utilized where appropriate, with differences being indicated by the suffix "a" or with different numerals. FIG. 11 illustrates wafer fragment 50 whereby gate 35 and electrically conductive sidewall spacers 39 and 40 are provided directly over insulating oxide layer 32, with the intermediate provision of thin film polysilicon layer 33 and gate layer 34 of the first embodiment being eliminated.

However, FIG. 12 illustrates provision of the same gate dielectric layer 34a over transistor gate 35 and sidewall spacers 39 and 40, with a thin film transistor layer 33a of semiconductive material being subsequently provided over gate dielectric layer 34a. Layer 33a can be provided to be in situ conductively doped or ion-implanted at the desired channel impurity concentration. Alternately and as shown, layer 33a is preferably provided to be undoped as-deposited, and a subsequently deposited and patterned photoresist layer 52 is provided. Photoresist layer 52 is patterned to cover all of thin film transistor layer 33a but for a desired channel region 36a. The wafer is then subjected to suitable conductivity doping to provide a desired concentration within channel region 36a.

Referring to FIG. 13, photoresist mask 52 has been stripped and a subsequent photoresist layer 54 deposited and patterned. Mask 54 covers the entirety of channel region 36a and effectively defines drain offset region 44a and source offset region 42a. In this regard and in accordance with the above preferred embodiment, mask 54 could also be patterned to cover only channel region 36a and drain offset region 44a. Regardless, the wafer fragment is subjected to a suitable high concentration implant to produce source and drain regions 45a and 46a. Drain offset region 44a is positioned operatively over electrically conductive sidewall spacer 40 and is gated thereby in accordance with the first described embodiment.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of forming a thin film transistor comprising the following steps:

forming a thin film transistor layer of semiconductive material;

forming a gate over the thin film transistor layer operatively adjacent a desired channel region of the thin film transistor layer;

providing at least one electrically conductive sidewall spacer over at least one lateral edge of the gate, the providing the spacer comprising:

providing an amorphous semiconductor material layer over the gate;

anisotropically etching the semiconductor material layer to form opposing sidewall spacers laterally adjacent the gate; and converting the amorphous layer to polycrystalline form after deposition of the amorphous layer; and after providing the sidewall spacer, subjecting unmasked areas of the thin film transistor layer to conductivity doping effective to form an electrically conductive source region and an electrically conductive drain region.

2. A method of forming a thin film transistor comprising the following steps:

forming a thin film transistor layer of semiconductive material;

forming a gate having a conductivity enhancing impurity over the thin film transistor layer operatively adjacent a desired channel region of the thin film transistor layer;

providing an undoped semiconductor material spacer-forming layer over the gate;

anisotropically etching the spacer-forming layer to form opposing sidewall spacers laterally adjacent the gate;

after providing the sidewall spacers, subjecting unmasked areas of the thin film transistor layer to conductivity doping effective to form an electrically conductive source region and an electrically conductive drain region; and rendering the sidewall spacers electrically conductive substantially by out-diffusion of conductivity enhancing impurity from the gate.

3. The method of forming a thin film transistor comprising the following steps:

forming a transistor gate relative to a substrate;

providing at least one electrically conductive sidewall spacer over at least one lateral edge of the gate, the providing the spacer comprising:
   forming an amorphous semiconductor material layer over the gate;
   anisotropically etching the semiconductor material layer to form opposing sidewall spacers laterally adjacent the gate; and
   converting the amorphous layer to polycrystalline form after deposition of the amorphous layer; and providing a thin film transistor layer of semiconductive material over the gate and sidewall spacer; and providing a source region, a drain region, a drain offset region, and a channel region in the thin film transistor layer; the drain offset region positioned operatively over the one electrically conductive sidewall spacer.

4. A method of forming a thin film transistor comprising the following steps:

forming a transistor gate having a conductivity enhancing impurity relative to a substrate;

providing an undoped semiconductor material spacer-forming layer over the gate;

anisotropically etching the spacer-forming layer to form opposing sidewall spacers laterally adjacent the gate;

providing a thin film transistor layer of semiconductive material over the gate and sidewall spacers;

providing a source region, a drain region, a drain offset region, and a channel region in the thin film transistor layer; the drain offset region being positioned operatively over one of the electrically conductive sidewall spacers; and rendering the sidewall spacers electrically conductive substantially by out-diffusion of conductivity enhancing impurity from the gate.

* * * * *